(12) United States Patent
Masunaga et al.

(10) Patent No.: US 8,866,363 B2
(45) Date of Patent: Oct. 21, 2014

(54) ELECTROSTATIC ACTUATOR HAVING URGING MEMBERS WITH VARYING RIGIDITIES

(75) Inventors: Takayuki Masunaga, Kanagawa-ken (JP); Hiroaki Yamazaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/421,142

(22) Filed: Mar. 15, 2012

(65) Prior Publication Data
US 2012/0235537 A1    Sep. 20, 2012

(30) Foreign Application Priority Data
Mar. 16, 2011    (JP) .................................. 2011-057936

(51) Int. Cl.
*H02N 1/00*    (2006.01)
*B81B 3/00*    (2006.01)

(52) U.S. Cl.
CPC ....... *B81B 3/0072* (2013.01); *B81B 2203/0163* (2013.01); *H01H 57/0009* (2013.01); *B81B 2201/016* (2013.01)
USPC .................... 310/309; 310/40 MM; 333/105; 333/262

(58) Field of Classification Search
CPC ................................ H02N 1/006; H02N 1/008
USPC .................... 310/309, 40 MM; 333/105, 262
See application file for complete search history.

(56) References Cited

U.S. PATENT DOCUMENTS

| | | | |
|---|---|---|---|
| 5,399,415 A * | 3/1995 | Chen et al. ..................... | 428/209 |
| 6,545,385 B2 * | 4/2003 | Miller et al. ................... | 310/309 |
| 2004/0140733 A1 * | 7/2004 | Keller ........................... | 310/309 |
| 2007/0017994 A1 * | 1/2007 | Wolter et al. ............. | 235/462.37 |
| 2007/0024401 A1 * | 2/2007 | Kim et al. ..................... | 333/262 |
| 2007/0241680 A1 * | 10/2007 | Ohmura et al. ............... | 313/533 |
| 2011/0063773 A1 * | 3/2011 | Ikehashi ....................... | 361/277 |
| 2011/0140570 A1 | 6/2011 | Masunaga et al. | |

FOREIGN PATENT DOCUMENTS

| | | |
|---|---|---|
| CN | 1896791 A | 1/2007 |
| JP | 11-304834 A | 11/1999 |

(Continued)

OTHER PUBLICATIONS

Office Action issued on Mar. 8, 2013, in Japanese Patent Application No. 2011-057936 with English Translation.

Combined Office Action and Search Report issued Jan. 8, 2014 in Taiwanese Patent Application No. 101107945 (with English language translation).

(Continued)

*Primary Examiner* — Terrance Kenerly
(74) *Attorney, Agent, or Firm* — Oblon, Spivak, McClelland, Maier & Neustadt, L.L.P.

(57) ABSTRACT

According to one embodiment, an electrostatic actuator includes a substrate, an electrode unit, a film body unit, and an urging unit. The electrode unit is provided on the substrate. The film body unit is provided to oppose the electrode unit and is conductive. The urging unit is configured to support the film body unit and includes a connection unit connected to the substrate and an elastic unit provided between the connection unit and the film body unit. A contacting state and a separated state are possible for the electrode unit and the film body unit according to a voltage applied to the electrode unit. The elastic unit has a branch portion between one end of the elastic unit connected to the connection unit and multiple one other ends of the elastic unit connected to the film body unit.

18 Claims, 9 Drawing Sheets

(56) References Cited

FOREIGN PATENT DOCUMENTS

| | | |
|---|---|---|
| JP | 2001-291463 A | 10/2001 |
| JP | 2005-279863 A | 10/2005 |
| JP | 2006-330505 A | 12/2006 |
| JP | 2008-172902 A | 7/2008 |
| JP | 2008-278634 | 11/2008 |
| JP | 2011-114988 | 6/2011 |

OTHER PUBLICATIONS

Chinese Office Action issued Jun. 5, 2014 in Chinese Patent Application No. 201210068873.7 w/ English translation.

"Design and Improvement of a Parallel Capacitor Type RF MEMS Switch Driven by a Low Voltage", Bai Cong Kai, "Data base of whole text of Chinese excellent master thesis, Process technology II series", Jun. 15, 2010, pp. 1-13.

* cited by examiner

ELECTROSTATIC ACTUATOR HAVING URGING MEMBERS WITH VARYING RIGIDITIES

CROSS-REFERENCE TO RELATED APPLICATIONS

This application is based upon and claims the benefit of priority from the prior Japanese Patent Application No. 2011-057936, filed on Mar. 16, 2011; the entire contents of which are incorporated herein by reference.

FIELD

Embodiments described herein relate generally to an electrostatic actuator.

BACKGROUND

An electrostatic actuator is known in which an electrostatic force is caused to act between a stator and a mover that are included in the actuator, and the mover is driven by the attraction force of the electrostatic force. Extremely small electrostatic actuators that use so-called semiconductor process technology (manufacturing technology of semiconductor devices) are being developed in fields such as MEMS (Micro Electro Mechanical Systems) and the like. In the fields of MEMS and the like, a so-called MEMS switch that utilizes an electrostatic actuator is known.

In electrostatically-driven MEMS switches, it is desirable to reduce the pull-in voltage, ensure creep resistance, or increase the reliability of hot switching and the like.

DETAILED DESCRIPTION

According to one embodiment, an electrostatic actuator includes a substrate, an electrode unit, a film body unit, and an urging unit. The electrode unit is provided on the substrate. The film body unit is provided to oppose the electrode unit and is conductive. The urging unit is configured to support the film body unit and includes a connection unit connected to the substrate and an elastic unit provided between the connection unit and the film body unit. A contacting state and a separated state are possible for the electrode unit and the film body unit according to a voltage applied to the electrode unit. The elastic unit has a branch portion between one end of the elastic unit connected to the connection unit and multiple one other ends of the elastic unit connected to the film body unit.

Embodiments of the invention will now be described with reference to the drawings. Similar components in the drawings are marked with like reference numerals, and a detailed description is omitted as appropriate. In the drawings, arrows X, Y, and Z illustrate directions orthogonal to each other.

Figure 1:
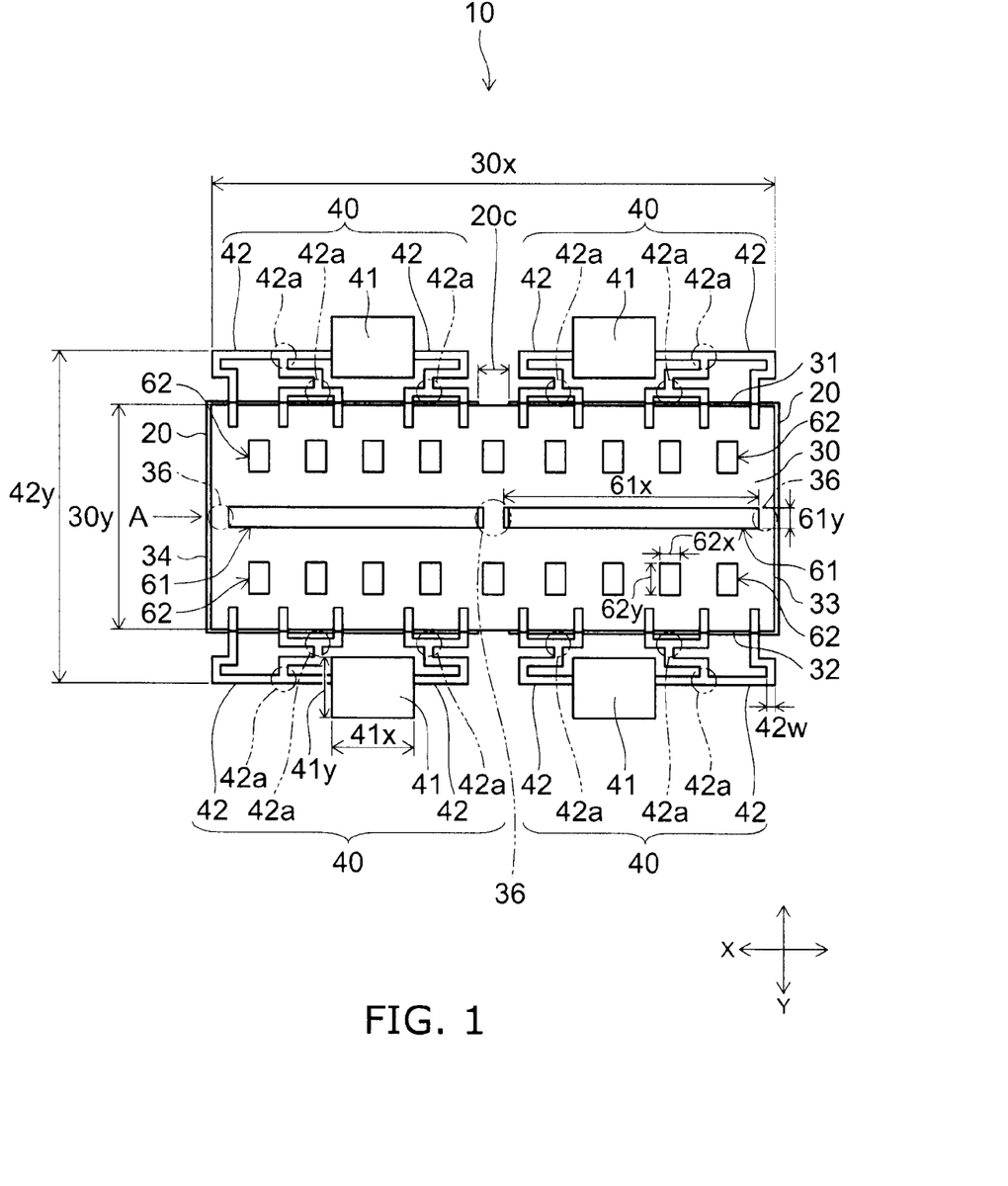
FIG. 1 is a schematic plan view illustrating the electrostatic actuator according to the embodiment of the invention.

FIG. 1 is a schematic plan view illustrating the electrostatic actuator according to the embodiment of the invention.

Figure 2A:
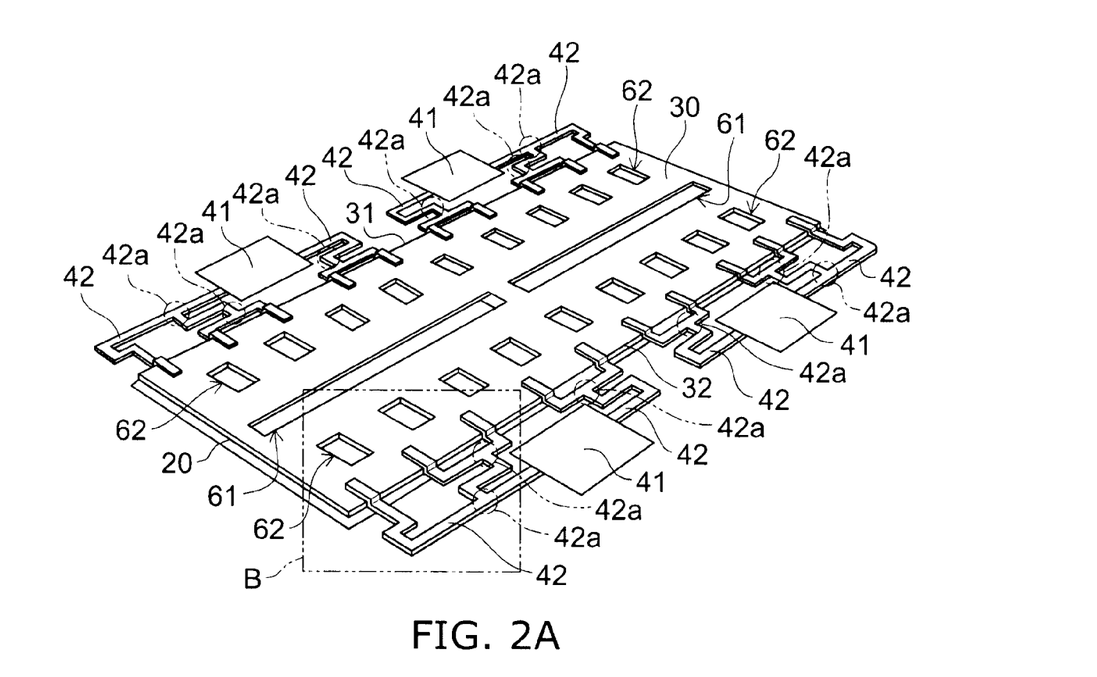
FIG. 2A and FIG. 2B are schematic perspective views illustrating the electrostatic actuator according to this embodiment.
Figure 2B:
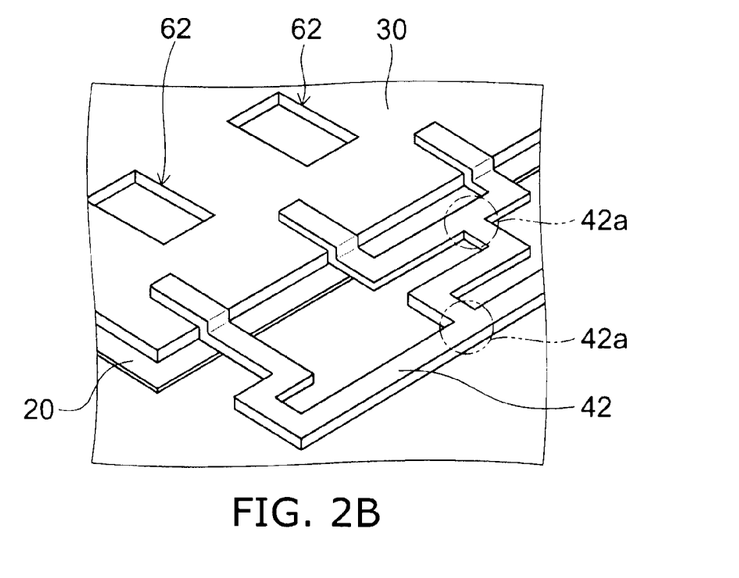

FIG. 2A and FIG. 2B are schematic perspective views illustrating the electrostatic actuator according to this embodiment.

Figure 3A:
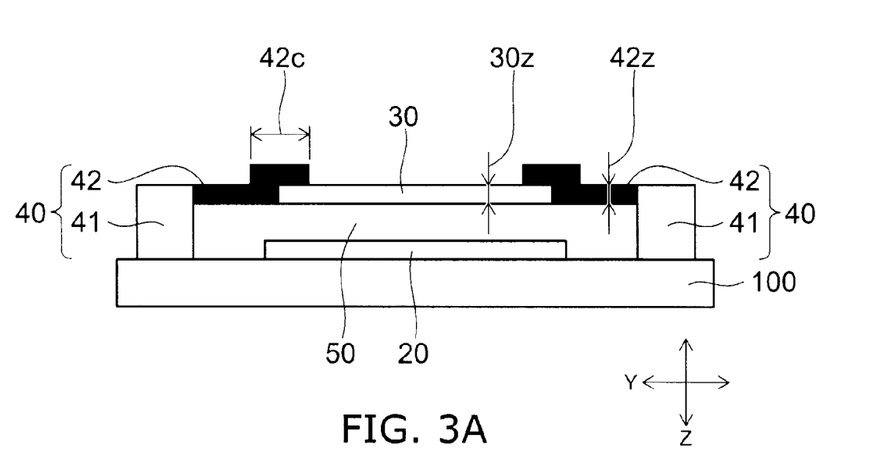
FIG. 3A to FIG. 3C are schematic plan views illustrating the drive of the electrostatic actuator according to this embodiment.
Figure 3B:
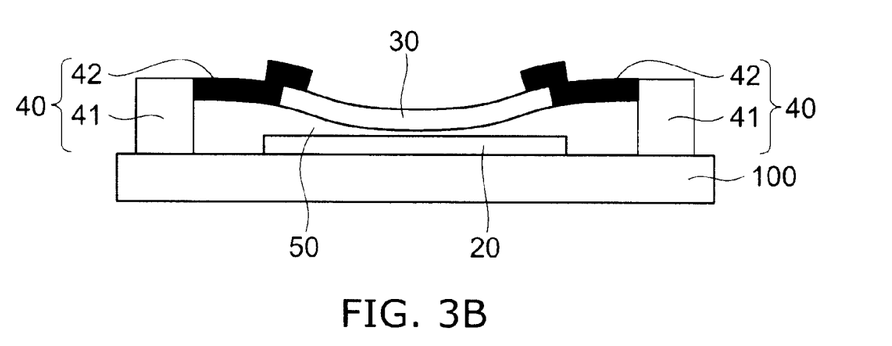
Figure 3C:
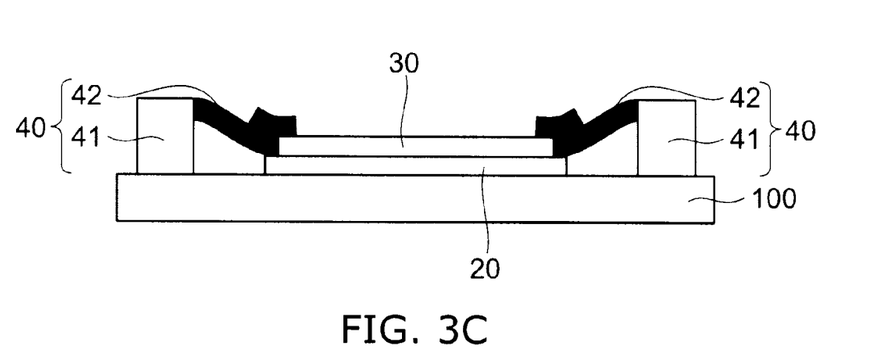

FIG. 3A to FIG. 3C are schematic plan views illustrating the drive of the electrostatic actuator according to this embodiment.

FIG. 2B is an enlarged schematic view of portion B illustrated in FIG. 2A. FIG. 3A to FIG. 3C are schematic plan views of the electrostatic actuator 10 according to this embodiment as viewed in the direction of the view along arrow A illustrated in FIG. 1.

FIG. 3A is a schematic plan view illustrating the case where a film body unit 30 of this embodiment is in the up-state. FIG. 3B is a schematic plan view illustrating the state in which the film body unit 30 of this embodiment is flexed. FIG. 3C is a schematic plan view illustrating the case where the film body unit 30 of this embodiment is in the down-state.

The electrostatic actuator 10 according to this embodiment includes an electrode unit 20, the film body unit 30, and an urging unit 40. As illustrated in FIG. 3A to FIG. 3C, the electrode unit 20 is provided on a substrate 100.

The electrode unit 20 is formed of, for example, a conductive material such as a metal, etc. In such a case, it is favorable for the material of the electrode unit 20 to be a conductive material with a low resistance value. Alternatively, it is favorable for the material of the electrode unit 20 to be usable in the film formation, the etching, and the like of so-called semiconductor processes (manufacturing technology of semiconductor devices). Such a material may include, for example, aluminum (Al), gold (Au), silver (Ag), copper (Cu), platinum (Pt), an alloy including these metals, and the like.

The major surface of the electrode unit 20 is covered with an insulating material. In such a case, it is favorable for the insulating material to be usable in the film formation, the etching, and the like of so-called semiconductor processes (manufacturing technology of semiconductor devices). Such a material may include, for example, silicon oxide (SiO, $SiO_2$, etc.), silicon nitride (SiN), and the like.

A not-illustrated direct-current power source is connected to the electrode unit 20. The not-illustrated direct-current power source can provide a positive charge or a negative charge to the electrode unit 20. Therefore, the electrode unit 20 can electrostatically attract the film body unit 30.

A not-illustrated signal generation unit is connected to the electrode unit 20. The not-illustrated signal generation unit can apply a signal voltage to the electrode unit 20. In other words, the voltage that is the sum of the signal voltage and the drive voltage for electrostatically attracting the film body unit 30 is applied to the electrode unit 20.

An example of a dimension 20c of the gap between two electrode units 20 is, for example, about 15 μm. Although the electrostatic actuator 10 illustrated in FIG. 1, FIG. 2A, and FIG. 2B includes two electrode units 20, the number of electrode units 20 disposed is not limited thereto.

The substrate 100 is formed of an insulating material such as, for example, glass, etc. Alternatively, the substrate 100 may be formed of a conductive material or a semiconductor material such as silicon (Si), etc.; and the surface of the substrate 100 may be covered with an insulating material.

The film body unit 30 is provided to oppose the electrode unit 20.

The film body unit 30 is formed of a conductive material such as a metal, etc. In such a case, it is favorable for the material of the film body unit 30 to be usable in the film formation, the etching, and the like of so-called semiconductor processes (manufacturing technology of semiconductor devices). Such a material may include, for example, aluminum (Al), gold (Au), silver (Ag), copper (Cu), platinum (Pt), an alloy including these metals, and the like.

The film body unit 30 has a rectangular configuration and has a first circumferential edge portion and a second circumferential edge portion that form at least portions of the long sides of the film body unit 30 and a third circumferential edge portion 33 and a fourth circumferential edge portion 34 that form at least portions of the short sides of the film body unit 30. The first circumferential edge portion and the second circumferential edge portion oppose each other. The third circumferential edge portion 33 and the fourth circumferential edge portion 34 oppose each other.

A first hole 61 and a second hole 62 are provided in the film body unit 30. The film body unit 30 has linking portions 36 at the third circumferential edge portion 33, the fourth circumferential edge portion 34, and a substantially central portion. That is, the film body unit 30 has three linking portions 36. Therefore, two first holes 61 are provided in the film body unit 30. However, the number of the first holes 61 and the linking portions 36 disposed are not limited thereto.

The first hole 61 has a rectangular configuration and extends in a first direction. The first hole 61 is provided in the substantially lateral-direction central portion of the film body unit 30. The longitudinal direction of the film body unit 30 is substantially parallel to the longitudinal direction (the first direction) of the first hole 61. Therefore, as illustrated in FIG. 3B, the film body unit 30 flexes more easily in the lateral direction than in the longitudinal direction. Thereby, the pull-in voltage can be reduced. Also, the hot switching ability can be improved. This is elaborated later.

The second hole 62 has a rectangular configuration and extends in a second direction. The second hole 62 is provided between the first hole 61 and the first circumferential edge portion 31 and between the first hole 61 and the second circumferential edge portion 32. The longitudinal direction (the second direction) of the second hole 62 is substantially orthogonal to the longitudinal direction of the film body unit 30. Therefore, the film body unit 30 flexes relatively easily in the longitudinal direction as well.

Examples of the dimensions of the film body unit 30, the first hole 61, and the second hole 62 are, for example, as follows.

A dimension $30x$ of the film body unit 30 in the longitudinal direction (the X direction) is, for example, about 275 µm (micrometers). A dimension $30y$ of the film body unit 30 in the lateral direction (the Y direction) is, for example, about 110 µm. A dimension $30z$ of the film body unit 30 in the thickness direction (the Z direction) is, for example, about 2 µm.

A dimension $61x$ of the first hole 61 in the longitudinal direction (the X direction) is, for example, about 124.5 µm. A dimension $61y$ of the first hole 61 in the lateral direction (the Y direction) is, for example, about 10 µm.

A dimension $62x$ of the second hole 62 in the lateral direction (the X direction) is, for example, about 10 µm. A dimension $62y$ of the second hole 62 in the longitudinal direction (the Y direction) is, for example, about 16 µm.

The urging units 40 are connected to the first circumferential edge portion 31 and the second circumferential edge portion 32 of the film body unit 30. The urging unit 40 connected to the first circumferential edge portion 31 and the urging unit 40 connected to the second circumferential edge portion 32 are provided at mutually-opposing positions. As illustrated in FIG. 1, FIG. 2A, and FIG. 2B, in the case where multiple urging units 40 are connected to the first circumferential edge portion 31 and multiple urging units 40 are connected to the second circumferential edge portion 32, the multiple urging units 40 connected to the first circumferential edge portion 31 and the multiple urging units 40 connected to the second circumferential edge portion 32 are provided at mutually-opposing positions.

The urging unit 40 includes a connection unit 41 and an elastic unit 42.

One end of the connection unit 41 is connected to the substrate 100; and one other end of the connection unit 41 is connected to the elastic unit 42. One end of the elastic unit 42 is connected to the connection unit 41; and one other end of the elastic unit 42 is connected to the first circumferential edge portion 31 or the second circumferential edge portion 32. As illustrated in FIG. 1, FIG. 2A, and FIG. 2B, multiple one other ends of the elastic unit 42 are connected to the first circumferential edge portion 31 or the second circumferential edge portion 32. The urging unit 40 is formed of an elastic material. Therefore, the urging unit 40 is a so-called elastic beam. The elastic unit 42 also functions as a damper unit.

The elastic unit 42 is provided to reduce the thermal stress caused by thermal expansion and the like. Then, the thermal stress can be reduced by the elastic unit 42 deforming in the case where thermal expansion occurs in the X direction and the Y direction. As illustrated in FIG. 1, FIG. 2A, and FIG. 2B, the elastic unit 42 has a branch portion 42a between the one end of the elastic unit 42 connected to the connection unit 41 and the multiple one other ends of the elastic unit 42 connected to the film body unit 30. In other words, the elastic unit 42 branches partway.

Thereby, the connection locations between the elastic unit 42 and the film body unit 30 can be increased. Therefore, the stress applied to one connection location can be reduced further. Thereby, the creep resistance of the urging unit 40 can be ensured. The number of connection units 41 disposed can be low while further increasing the connection locations between the elastic unit 42 and the film body unit 30 because the elastic unit 42 has the branch portion 42a. Thereby, the electrostatic actuator 10 can be downsized. Further, the surface area of the elastic unit 42 can be smaller by the elastic unit 42 having the branch portion 42a. Thereby, the failure probability of the elastic unit 42 of the urging unit 40 can be reduced. These are elaborated later.

It is favorable for the material of the urging unit 40 to be usable in the film formation, the etching, and the like of so-called semiconductor processes (manufacturing technology of semiconductor devices). Such a material may include, for example, silicon nitride (SiN), silicon oxide (SiO, $SiO_2$, etc.), metals such as titanium aluminide (TiAl, $Ti_3Al$, $Al_3Ti$, etc.), aluminum (Al), etc. In such a case, when considering the life of the urging unit 40 (the number of bends until fracture), it is favorable for the urging unit 40 to be formed of a material having a high resistance to creep deformation.

According to knowledge obtained by the inventors, it is favorable for the urging unit 40 to be formed of a material having a resistance to the creep deformation higher than that of aluminum (Al). For example, of those described above, it is favorable for the urging unit 40 to be formed of silicon nitride (SiN), silicon oxide (SiO, $SiO_2$, etc.), and titanium aluminide (TiAl, $Ti_3Al$, $Al_3Ti$, etc.).

Examples of the dimensions of the connection unit 41 and the elastic unit 42 are, for example, as follows. A dimension 41x of the connection unit 41 in the longitudinal direction (the X direction) is, for example, about 40 μm. The dimension 41y of the connection unit 41 in the lateral direction (the Y direction) is, for example, about 30 μm. A dimension 42w of the width direction of the elastic unit 42 is, for example, about 4 μm. A dimension 42z of the elastic unit 42 in the thickness direction (the Z direction) is, for example, about 1.5 μm. A dimension 42c of the connection location between the elastic unit 42 and the film body unit 30 is, for example, about 10 μm. A distance 42y between the end portion of the elastic unit 42 connected to the first circumferential edge portion 31 and the end portion of the elastic unit 42 connected to the second circumferential edge portion 32 is, for example, about 164 μm.

As illustrated in FIG. 3A, the film body unit 30 is supported by the urging unit 40 such that a gap 50 of a prescribed dimension is made between the major surface of the film body unit 30 and the major surface of the electrode unit 20 in the state in which a voltage is not applied to the electrode unit 20. An example of the dimension 50z of the gap 50 of the state in which the voltage is not applied to the electrode unit 20 is, for example, about 2.5 μm.

For example, a not-illustrated flexible grounding portion is connected to the film body unit 30. In such a case, the film body unit 30 has the ground potential. Therefore, the electrical capacitance between the film body unit 30 and the electrode unit 20 can be changed by changing the dimension of the gap 50 made between the major surface of the film body unit 30 and the major surface of the electrode unit 20. Then, this electrical capacitance change can be utilized in switching and the like. The film body unit 30 is not limited to having the ground potential.

The drive of the electrostatic actuator 10 according to this embodiment will now be described further with reference to FIG. 3A to FIG. 3C.

As illustrated in FIG. 3A, the film body unit 30 is separated from the electrode unit 20 in the state in which a potential difference is not applied between the electrode unit 20 and the film body unit 30. That is, the film body unit 30 is in the up-state. Continuing, the electrode unit 20 and the film body unit 30 are pulled toward each other in opposition to the elastic force (the restoring force) of the elastic unit 42 by the electrostatic attraction force when the potential difference is applied between the electrode unit 20 and the film body unit 30. Thereby, as illustrated in FIG. 3B, the film body unit 30 is driven in the Z direction, i.e., the direction of the electrode unit 20.

At this time, as described above, the film body unit 30 has the first hole 61. The first hole 61 is provided such that the longitudinal direction of the film body unit 30 is substantially parallel to the longitudinal direction of the first hole 61. Therefore, as illustrated in FIG. 3B, the film body unit 30 flexes more easily in the lateral direction than in the longitudinal direction. Continuing, the film body unit 30 contacts the electrode unit 20 and is in the down-state (pull in) as illustrated in FIG. 3C when a potential difference greater than that of the state illustrated in FIG. 3B is applied between the electrode unit 20 and the film body unit 30. Thereby, a switching operation is performed.

When driving the electrostatic actuator 10 according to this embodiment, a bias voltage is applied to the electrode unit 20 and the film body unit 30. For example, the voltage is applied to the electrode unit 20; and 0 V (volts) is supplied to the film body unit 30. Alternatively, for example, 0 V (volts) is applied to the electrode unit 20; and a voltage is supplied to the film body unit 30. Alternatively, the orientation of the electric field may be appropriately interchanged according to the number of drives and/or the capacitance value.

On the other hand, when the potential difference applied between the electrode unit 20 and the film body unit 30 is smaller than the potential difference (the pull-in voltage) applied during the pull in, the electrostatic attraction force generated between the electrode unit 20 and the film body unit 30 is smaller than the elastic force of the elastic unit 42. In such a case, the film body unit 30 separates from the electrode unit 20 and is in the up-state (pull out). Generally, the absolute value of the pull-in voltage is larger than the absolute value of the potential difference (the pull-out voltage) applied during the pull out.

At this time, in the case where a signal voltage is applied to the electrode unit 20, an electrostatic attraction force is generated between the electrode unit 20 and the film body unit 30 due to the signal voltage as well. Generally, an electrostatic actuator, it is necessary to perform the pull out also in the state in which the signal voltage is applied to the electrode unit 20 and the electrostatic attraction force is generated. This is called, for example, hot switching and the like. It is desirable to reduce the pull-in voltage and improve the hot switching ability of the electrostatic actuator. Here, in the specification of the application, the hot switching ability refers to the ability of the film body unit 30 to separate from the electrode unit 20 or the ease of the separation between the film body unit 30 and the electrode unit 20 in the state in which the voltage is applied to the electrode unit 20.

An example of results of simulations implemented by the inventor will now be described with reference to the drawings.

Figure 4:
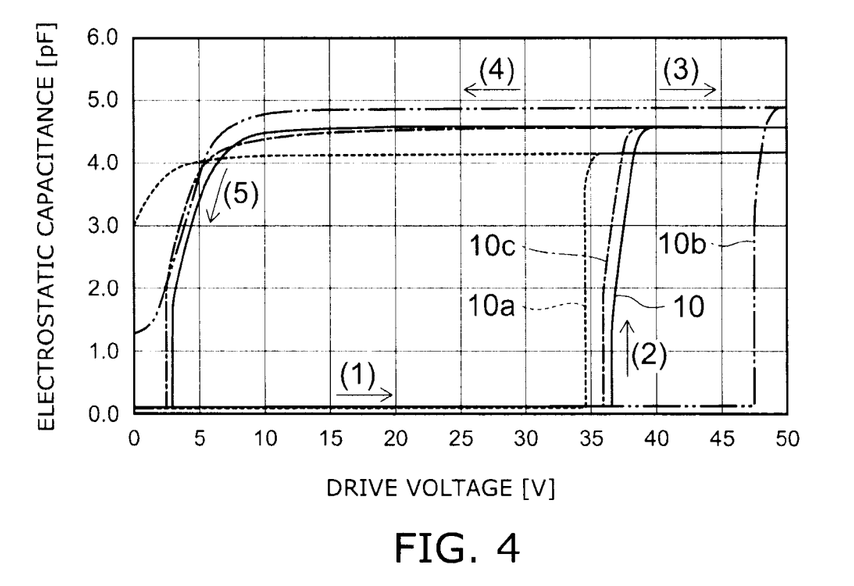
FIG. 4 is a graph illustrating an example of the simulation results of drive characteristics of the electrostatic actuator.

FIG. 4 is a graph illustrating an example of the simulation results of drive characteristics of the electrostatic actuator.

Figure 5:
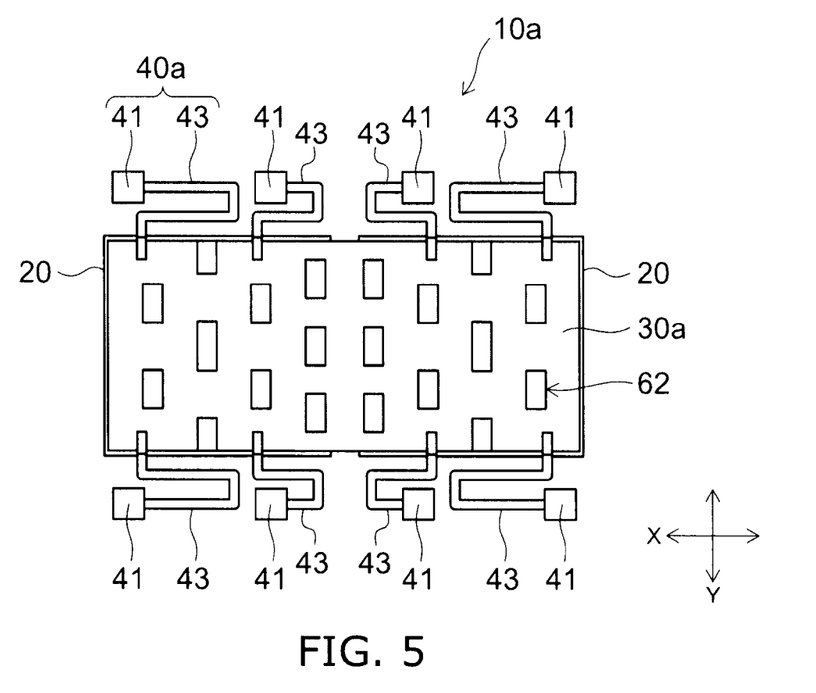
FIG. 5 is a schematic plan view illustrating an electrostatic actuator according to a comparative example.

FIG. 5 is a schematic plan view illustrating an electrostatic actuator according to a comparative example.

Figure 6A:
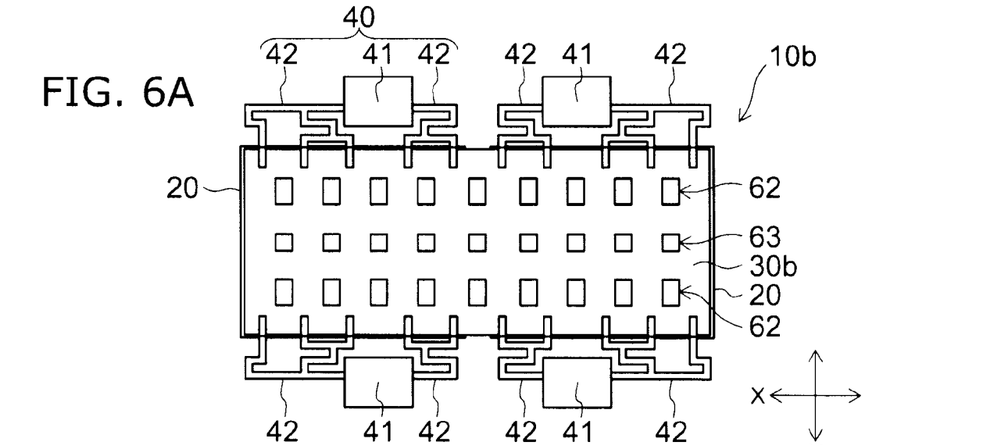
FIG. 6A to FIG. 6C are schematic plan views illustrating electrostatic actuators according to this embodiment.
Figure 6B:
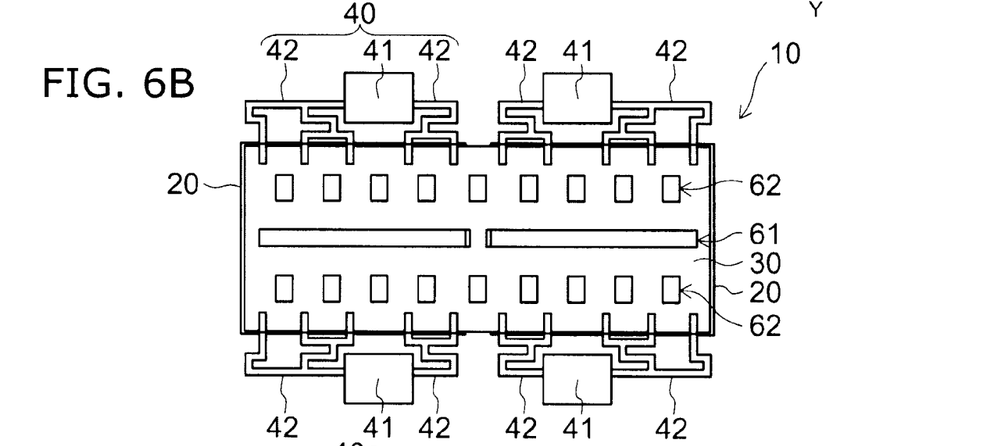
Figure 6C:
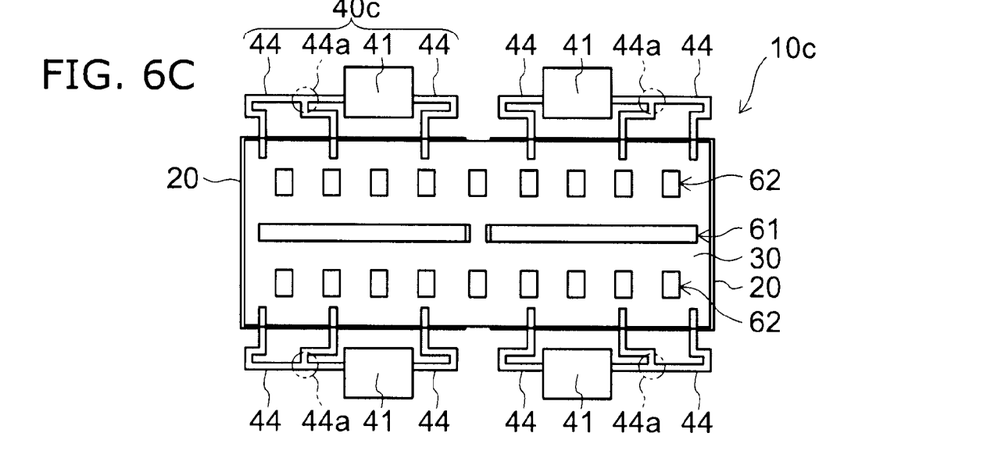

FIG. 6A to FIG. 6C are schematic plan views illustrating electrostatic actuators according to this embodiment.

The structure of the electrostatic actuator illustrated in FIG. 6B is similar to the structure of the electrostatic actuator described above in regard to FIG. 1 to FIG. 3C.

FIG. 4 illustrates a FEM (Finite Element Method) simulation of the drive characteristics of the electrostatic actuator. The vertical axis illustrates the electrostatic capacitance; and the horizontal axis illustrates the drive voltage. In such a case, although the electrostatic attraction force is generated not only by the drive voltage but also by the signal voltage, the most stringent conditions for the drive characteristics were used in this simulation. Namely, the calculations were performed with a signal voltage of 0 V (volts) applied during the pull in and a signal voltage of 7.5 V (volts) applied during the pull out.

As illustrated in FIG. 4, the drive voltage is applied to the electrode unit 20 by a not-illustrated current source in the case when the film body unit 30 is pulled toward the electrode unit 20 by the electrostatic attraction force. The film body unit 30 is pulled toward the electrode unit 20 by the electrostatic attraction force because a positive charge or a negative charge is provided to the electrode unit 20 when the drive voltage is applied to the electrode unit 20. Then, as in arrow (1) illustrated in FIG. 4, the film body unit 30 contacts the electrode unit 20 (pull in) at the pull-in voltage because the electrostatic attraction force increases as the drive voltage increases. At this time, as in arrow (2) illustrated in FIG. 4, the electrostatic capacitance increases more abruptly than the change of the electrostatic capacitance of the portion of arrow (1).

The pull-in voltage of the electrostatic actuator 10a according to the comparative example illustrated in FIG. 5 is 34.5 V (volts). As illustrated in FIG. 5, the electrostatic actuator 10a according to the comparative example includes a film body unit 30a and an urging unit 40a. The film body unit 30a does not have the first hole 61 as in the film body unit 30 illustrated in FIG. 1, FIG. 2A, and FIG. 2B. The film body unit 30a has the second hole 62. The urging unit 40a includes the connection unit 41 and an elastic unit 43. The elastic unit 43 of this comparative example does not have the branch portion between the one end connected to the connection unit 41 and the multiple one other ends connected to the film body unit 30a as in the elastic unit 42 illustrated in FIG. 1, FIG. 2A, and FIG. 2A. That is, the elastic unit 43 of this comparative example does not branch partway.

The rigidity of the elastic unit 43 of this comparative example is lower than the rigidity of elastic units 42 and 44 of this embodiment illustrated in FIG. 6A to FIG. 6C. In other words, the rigidity of the elastic units 42 and 44 of this embodiment illustrated in FIG. 6A to FIG. 6C is higher than the rigidity of the elastic unit 43 of this comparative example. One reason thereof is, for example, to improve the hot switching ability. That is, this is to make the hot switching possible in the state in which, for example, the drive voltage is 0 V (volts) and in the state in which a signal voltage of 7.5 V (volts) is applied to the electrode unit 20. Otherwise, the structure of the electrostatic actuator 10a is similar to the structure of the electrostatic actuator 10 described above in regard to FIG. 1 to FIG. 3C.

The pull-in voltage of the electrostatic actuator 10b according to this embodiment illustrated in FIG. 6A is 47.5 V (volts). As illustrated in FIG. 6A, the electrostatic actuator 10b includes a film body unit 30b. The film body unit 30b has a third hole 63 instead of the first hole 61. As illustrated in FIG. 6A, the third hole 63 is not provided such that the longitudinal direction of the film body unit 30b is substantially parallel to the longitudinal direction of the third hole 63. The multiple third holes 63 are disposed substantially along the longitudinal direction at substantially lateral-direction central positions. Otherwise, the structure of the electrostatic actuator 10b is similar to the structure of the electrostatic actuator 10 described above in regard to FIG. 1 to FIG. 3C.

The pull-in voltage of the electrostatic actuator 10 according to this embodiment illustrated in FIG. 6B is 36.5 V (volts). The structure of the electrostatic actuator 10 is as described above in regard to FIG. 1 to FIG. 3C.

The pull-in voltage of the electrostatic actuator 10c according to this embodiment illustrated in FIG. 6C is 36 V (volts). As illustrated in FIG. 6C, the electrostatic actuator 10c includes an urging unit 40c. The urging unit 40c includes the connection unit 41 and the elastic unit 44. The elastic unit 44 of the electrostatic actuator 10c has a branch portion 44a between the one end connected to the connection unit 41 and the multiple one other ends connected to the film body unit 30. In other words, the elastic unit 44 branches partway. The elastic unit 44 illustrated in FIG. 6C has fewer branch portions 44a than the branch portions 42a of the elastic units 42 illustrated in FIG. 6A and FIG. 6B (referring to FIG. 1, FIG. 2A, and FIG. 2B). Therefore, there are fewer connection locations between the elastic unit 44 and the film body unit 30 illustrated in FIG. 6C than between the elastic unit 42 and the film body unit 30b illustrated in FIG. 6A and between the elastic unit 42 and the film body unit 30 illustrated in FIG. 6B. Otherwise, the structure of the electrostatic actuator 10c is similar to the structure of the electrostatic actuator 10 described above in regard to FIG. 1 to FIG. 3C.

Therefore, it is obvious that there are cases where the pull-in voltage increases as in the electrostatic actuator 10b illustrated in FIG. 6A in the case where the rigidity of the elastic units 42 and 44 is higher than that of the electrostatic actuator 10a according to the comparative example. Conversely, in the electrostatic actuators 10 and 10c illustrated in FIG. 6B and FIG. 6C, it is easier to flex in the lateral direction when the film body unit 30 has the first hole 61 than when the film body unit 30 does not have the first hole 61.

When the film body unit 30 is pulled toward the electrode unit 20 by the electrostatic attraction force, first, the portion where the first hole 61 is provided, i.e., the portion at the lateral-direction center position of the film body unit 30, flexes (referring to FIG. 3B). Then, the dimension of the gap 50 decreases at the portion where the first hole 61 is provided. Here, the electrostatic attraction force is inversely proportional to the square of the dimension of the gap 50 made between the major surface of the film body unit 30 and the major surface of the electrode unit 20. Therefore, a large electrostatic attraction force is generated as the dimension of the gap 50 decreases. Thereby, the film body unit 30 is pulled toward the electrode unit 20 more easily. Then, the film body unit 30 flexes to be curved by being pulled at the portion where the first hole 61 is provided. Continuing, the portion where the dimension of the gap 50 is smaller, i.e., the portion where a larger electrostatic attraction force is generated, gradually enlarges in the Y direction.

Therefore, although the rigidity of the elastic units 42 and 44 is higher than the rigidity of the elastic unit 43 of the comparative example, the film body unit 30 can contact the electrode unit 20 as easily as in the electrostatic actuator 10a according to the comparative example. Thereby, it is obvious that the first hole 61 has the effect of reducing the pull-in voltage. That is, it is obvious that, in the case where the film body unit 30 has the first hole 61, the increase of the pull-in voltage can be suppressed while increasing the rigidity of the elastic units 42 and 44 to be greater than the rigidity of the elastic unit 43 of the comparative example and the pull-in voltage can be reduced to be equal to that of the electrostatic actuator 10a according to the comparative example. It is obvious that the pull-in voltage is relatively low in the electrostatic actuator 10a according to the comparative example as well.

Continuing, the drive voltage is increased to 50 V (volts) as in arrow (3) illustrated in FIG. 4. At this point in time, a signal voltage of 7.5 V (volts) is applied to the electrode unit 20 by a not-illustrated signal generation unit. Thus, in the case where the signal voltage is applied to the electrode unit 20, the electrostatic attraction force is generated by a voltage that is the sum of the drive voltage and the signal voltage. For example, in the case where the drive voltage is 50 V (volts), the electrostatic attraction force is generated by a voltage of 57.5 V (volts) which is the sum of the drive voltage of 50 V (volts) and the signal voltage of 7.5 V (volts).

In the case where the film body unit 30 is caused to separate from the electrode unit 20, the application of the drive voltage to the electrode unit 20 by the not-illustrated direct-current power source is stopped. When the application of the drive voltage to the electrode unit 20 is stopped, the electrostatic attraction force due to the drive voltage dissipates because the supply of the positive charge or the negative charge to the electrode unit 20 is stopped. Then, the film body unit 30 separates from the electrode unit 20 at the pull-out voltage because the electrostatic attraction force decreases as the drive voltage decreases as in arrow (4) illustrated in FIG. 4. At this time, as in arrow (5) illustrated in FIG. 4, the electrostatic capacitance decreases more abruptly than the change of the electrostatic capacitance of the portion of arrow (4).

As described above, there may be cases where the film body unit 30a of the comparative example cannot separate from the electrode unit 20 because the rigidity of the elastic unit 43 of the electrostatic actuator 10a according to the comparative example is lower than the rigidity of the elastic units 42 and 44 of this embodiment. Even in the case where the drive voltage is 0 V (volts), the signal voltage of 7.5 V (volts) is applied to the electrode unit 20. Therefore, the electrostatic attraction force is generated by the signal voltage of 7.5 V (volts). In the electrostatic actuator 10a according to the comparative example, there may be cases where the film body unit 30a of the comparative example remains in contact with the electrode unit 20 and cannot separate in the case where the electrostatic attraction force due to the signal voltage is larger than the elastic force of the elastic unit 43 of the comparative example.

Further, it is obvious that there may be cases where the film body unit 30b cannot completely separate from the electrode unit 20 as in, for example, the electrostatic actuator 10b illustrated in FIG. 6A even in the case where the rigidity of the elastic unit 42 is higher than the rigidity of the elastic unit 43 of the comparative example. In the electrostatic actuator 10b illustrated in FIG. 6A, there may be cases where a portion of the film body unit 30b can separate from the electrode unit 20 but another portion of the film body unit 30b cannot separate from the electrode unit 20.

Conversely, it is easy to flex in the lateral direction in the case where the film body unit 30 has the first hole 61 as in the electrostatic actuators 10 and 10c illustrated in FIG. 6B and FIG. 6C.

When the electrostatic attraction force dissipates, first, the first circumferential edge portion 31 (referring to FIG. 1) and the second circumferential edge portion 32 (referring to FIG. 1) of the film body unit 30 separate from the electrode unit 20 due to the elastic force of the elastic units 42 and 44. The dimension of the gap 50 increases at the portion where the film body unit 30 separates from the electrode unit 20. Therefore, the electrostatic attraction force decreases at the portion where the film body unit 30 separates from the electrode unit 20; and the film body unit 30 can separate more easily from the electrode unit 20. Then, the film body unit 30 flexes to be curved by being pulled at the portion where the film body unit 30 separates from the electrode unit 20. Continuing, the portion where the dimension of the gap 50 increases, i.e., the portion where the electrostatic attraction force is smaller, gradually enlarges in the Y direction.

Therefore, the film body unit 30 of the electrostatic actuators 10 and 10c illustrated in FIG. 6B and FIG. 6C can separate more easily from the electrode unit 20. In other words, the film body unit 30 can be caused to separate from the electrode unit 20 in the state of the higher voltage being applied to the electrode unit 20. Thereby, it is obvious that the first hole 61 has the effect of increasing the pull-out voltage and improving the hot switching ability.

In this simulation, the most stringent conditions for the drive characteristics were used for convenience of description. Therefore, although there may be cases where the film body unit 30b cannot separate completely from the electrode unit 20 in the electrostatic actuator 10b illustrated in FIG. 6A, this does not mean that the electrostatic actuator 10b illustrated in FIG. 6A is not included in the embodiment of the invention. The elastic unit 42 of the electrostatic actuator 10b illustrated in FIG. 6A has the branch portion 42a described above in regard to FIG. 1 to FIG. 3C. Therefore, the electrostatic actuator 10b illustrated in FIG. 6A is included in the embodiment of the invention. The pull-in voltage is relatively low in the electrostatic actuator 10a according to the comparative example as well. Therefore, the description of this embodiment does not mean that the electrostatic actuator 10a according to the comparative example is problematic.

Figure 7:
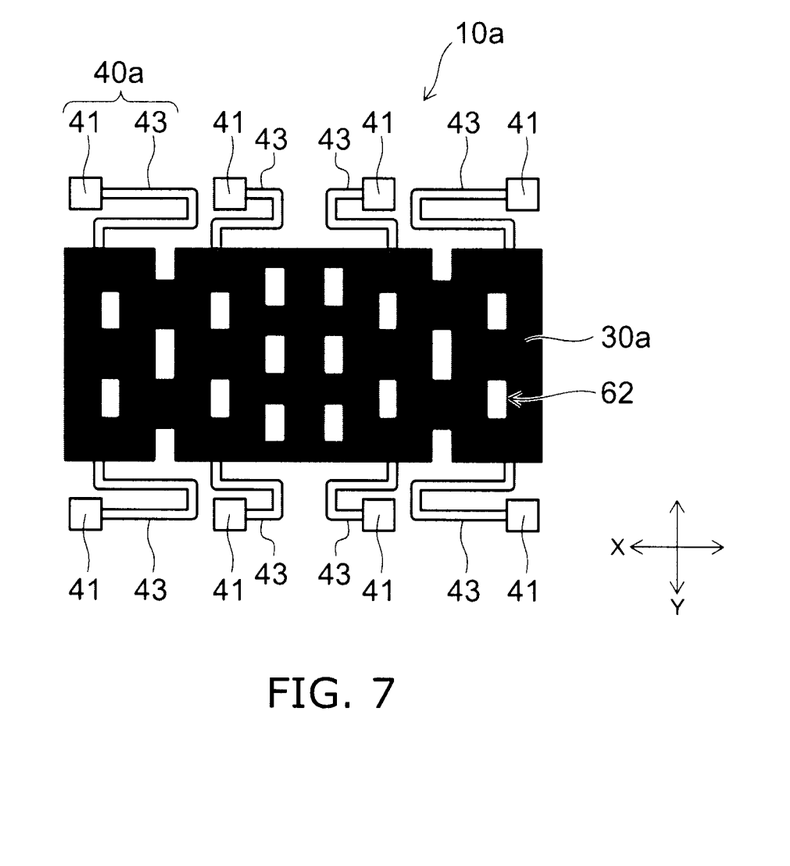
FIG. 7 is a schematic plan view illustrating an example of simulation results of the stress distribution of the electrostatic actuator according to the comparative example.

FIG. 7 is a schematic plan view illustrating an example of simulation results of the stress distribution of the electrostatic actuator according to the comparative example.

Figure 8A:
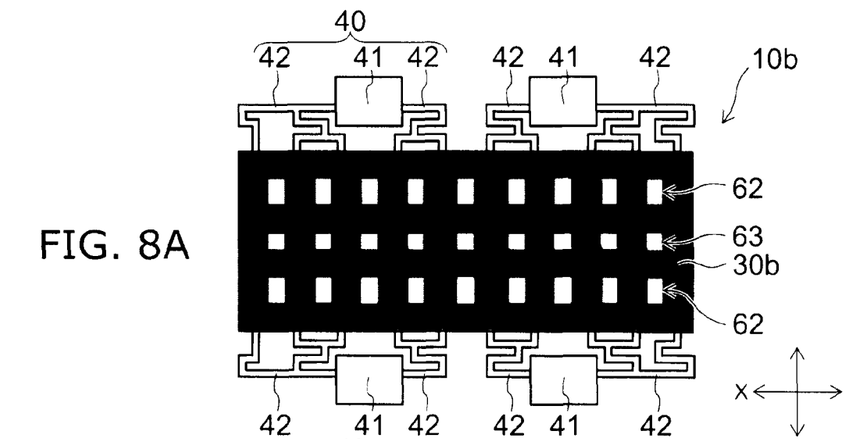
FIG. 8A to FIG. 8C are schematic plan views illustrating an example of simulation results of the stress distribution of the electrostatic actuators according to this embodiment.
Figure 8B:
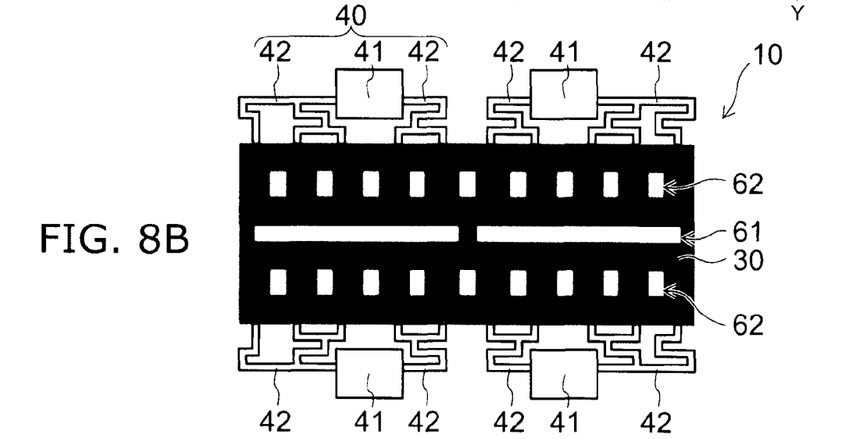
Figure 8C:
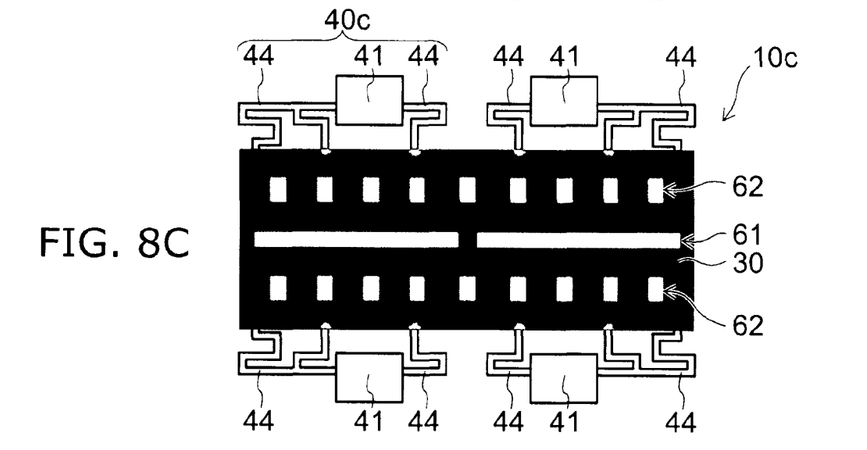

FIG. 8A to FIG. 8C are schematic plan views illustrating an example of simulation results of the stress distribution of the electrostatic actuators according to this embodiment.

FIG. 7 and FIG. 8A to FIG. 8C illustrate an elastic analysis result by a FEM (finite element method) simulation of the von Mises stress of the connection locations between the film body unit and the elastic unit in the state in which the drive voltage of 50 V (volts) is applied to the electrode unit 20. As described above in regard to FIG. 4, the film body unit 30 contacts the electrode unit 20 (after the pull in) in the state in which the drive voltage of 50 V (volts) is applied to the electrode unit 20. At this time, a signal voltage of 7.5 V (volts) is applied to the electrode unit 20 by a not-illustrated signal generation unit. The value of the von Mises stress is illustrated by monotone shading. Larger von Mises stresses are light, and smaller von Mises stresses are dark.

The structure of the electrostatic actuator 10a according to the comparative example illustrated in FIG. 7 is similar to that of the electrostatic actuator 10a described above in regard to FIG. 5. The structures of the electrostatic actuators 10b, 10, and 10c according to this embodiment illustrated in FIG. 8A to FIG. 8C are similar to the structures of the electrostatic actuators 10b, 10, and 10c illustrated in FIG. 6A to FIG. 6C.

In the electrostatic actuator 10a according to the comparative example illustrated in FIG. 7, the maximum value of the von Mises stress of the connection locations between the film body unit 30a and the elastic unit 43 is 76 MPa (megapascals). In the electrostatic actuator 10b according to this embodiment illustrated in FIG. 8A, the maximum value of the von Mises stress of the connection locations between the film body unit 30b and the elastic unit 42 is 76 MPa (megapascals). In the electrostatic actuator 10 according to this embodiment illustrated in FIG. 8B, the maximum value of the von Mises stress of the connection locations between the film body unit 30 and the elastic unit 42 is 76 MPa (megapascals). In the electrostatic actuator 10c according to this embodiment illustrated in FIG. 8C, the maximum value of the von Mises stress of the connection locations between the film body unit 30 and the elastic unit 44 is 176 MPa (megapascals).

In the electrostatic actuator 10a according to the comparative example as described above in regard to FIG. 4 to FIG. 6C, there may be cases where the hot switching cannot be performed in the state in which the signal voltage of 7.5 V (volts) is applied to the electrode unit 20 even in the case where the drive voltage is 0 V (volts). Conversely, in the case where the rigidity of the elastic unit is higher, there are cases where the hot switching is possible in the state in which the drive voltage of 0 V (volts) and in the state in which the signal voltage of 7.5 V (volts) is applied to the electrode unit 20.

Here, although the hot switching ability improves in the case where the rigidity of the elastic unit is higher, there may be cases where the maximum value of the von Mises stress of the connection locations between the film body unit 30 and the elastic unit 44 as in, for example, the electrostatic actuator 10c illustrated in FIG. 8C is higher than the maximum value of the von Mises stress of the connection locations between the film body unit 30a and the elastic unit 43 of the comparative example.

Conversely, as in the electrostatic actuators 10b and 10 illustrated in FIG. 8A and FIG. 8B, there are more connection locations between the elastic unit 42 and the film body unit 30b and between the elastic unit 42 and the film body unit 30 in the case where there are more branch portions 42a of the elastic unit 42. Therefore, the stress applied to each of the connection locations between the elastic unit 42 and the film body unit 30b and between the elastic unit 42 and the film body unit 30 can be reduced. That is, in the case where the elastic unit 42 has the branch portion 42a, it is obvious that the stress applied to each of the connection locations between the elastic unit 42 and the film body unit 30b and between elastic unit 42 and the film body unit 30 can be reduced to the same stress as that of the electrostatic actuator 10a according to the comparative example while increasing the rigidity of the elastic unit 42 and improving the hot switching ability. Thereby, it is obvious that the branch portion 42a of the elastic unit 42 has the effect of ensuring the creep resistance of the urging units 40 and 40c. It is obvious that the branch portion 42a of the elastic unit 42 has the effect of downsizing the electrostatic actuators 10 and 10c and limiting the number of connection units 41 disposed while increasing the connection locations between the elastic unit 42 and the film body unit 30b and between the elastic unit 42 and the film body unit 30. Further, the surface area of the elastic unit 42 can be smaller by the elastic unit 42 having the branch portion 42a. Thereby, it is obvious that the branch portion 42a has the effect of further reducing the failure probability of the elastic unit 42 of the urging units 40 and 40c.

In this simulation, the most stringent conditions for the drive characteristics were used for convenience of description. Therefore, although the maximum value of the von Mises stress of the connection locations between the film body unit 30 and the elastic unit 44 in the electrostatic actuator 10c illustrated in FIG. 8C were larger than those of the electrostatic actuator 10a according to the comparative example, this does not mean that the electrostatic actuator 10c illustrated in FIG. 8C is not included in the embodiment of the invention. The elastic unit 44 in the electrostatic actuator 10c illustrated in FIG. 8C has the branch portion 44a (referring to FIG. 6C); and the film body unit 30 has the first hole 61 described above in regard to FIG. 1 to FIG. 3C. Therefore, the electrostatic actuator 10c illustrated in FIG. 8C is included in the embodiment of the invention. The maximum value of the von Mises stress of the connection locations between the film body unit 30a and the elastic unit 43 is relatively low in the electrostatic actuator 10a according to the comparative example as well. Therefore, the description of this embodiment does not mean that the electrostatic actuator 10a according to the comparative example is problematic.

Figure 9A:
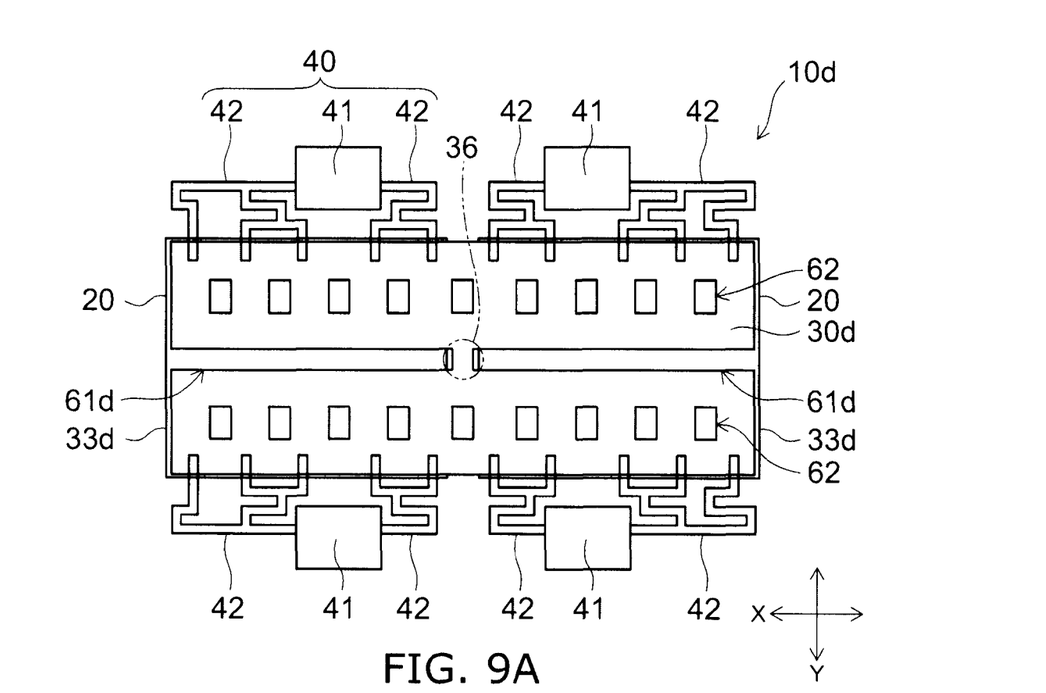
FIG. 9A and FIG. 9B are schematic plan views illustrating electrostatic actuators according to other embodiments of the invention.
Figure 9B:
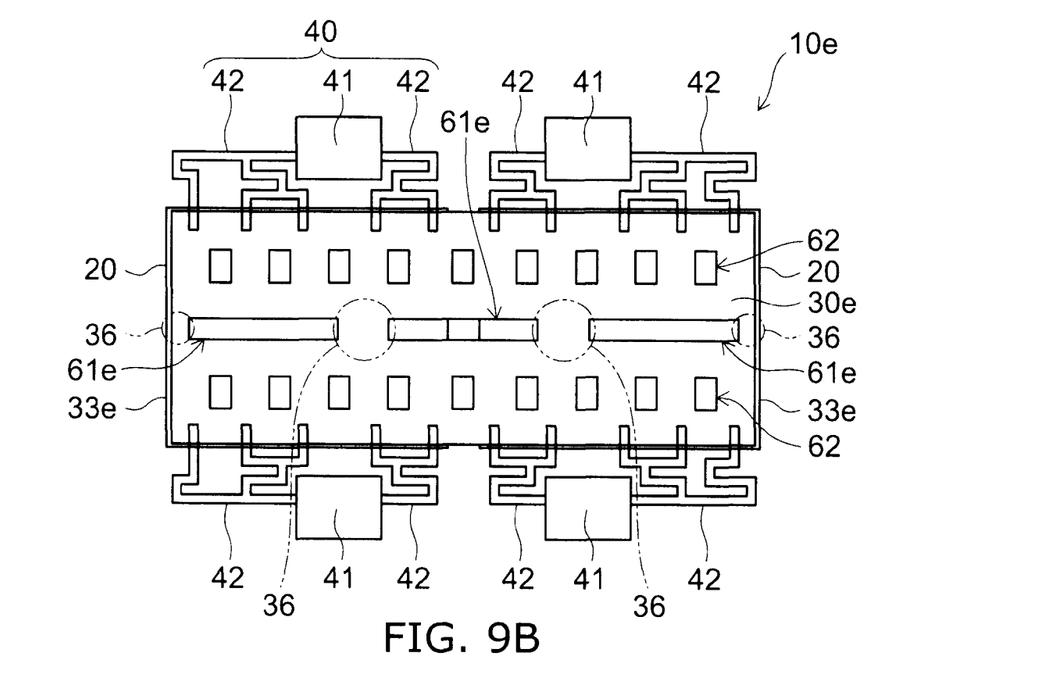

FIG. 9A and FIG. 9B are schematic plan views illustrating electrostatic actuators according to other embodiments of the invention.

A film body unit 30d of the electrostatic actuator 10d illustrated in FIG. 9A has one linking portion 36 in a substantially central portion. On the other hand, the film body unit 30d does not have the linking portion 36 at a third circumferential edge portion 33d and a fourth circumferential edge portion 34d. That is, two first holes 61d are provided in the film body unit 30d; and one end of each of the first holes 61d is open at the third circumferential edge portion 33d and the fourth circumferential edge portion 34d.

Thereby, the film body unit 30d of the electrostatic actuator 10d illustrated in FIG. 9A flexes more easily in the lateral direction than the film body unit 30 of the electrostatic actuator 10 described above in regard to FIG. 1 to FIG. 3C. Thereby, the pull-in voltage can be reduced further. Also, the hot switching ability can be improved further.

A film body unit 30e of the electrostatic actuator 10e illustrated in FIG. 9B has the linking portions 36 at a third circumferential edge portion 33e and a fourth circumferential edge portion 34e respectively. The film body unit 30e also has two linking portions 36 between the third circumferential edge portion 33e and the fourth circumferential edge portion 34e. That is, the film body unit 30e has four linking portions 36. Therefore, three first holes 61e are provided in the film body unit 30e.

Thereby, unnecessary deformation of the film body unit 30e can be suppressed; and operations can be stabilized. Therefore, the displacement amount (the warp amount) of the film body unit 30e when the film body unit 30e is pulled toward the electrode unit 20 can be caused to change while being controlled more stably than for the film body unit 30 of the electrostatic actuator 10 described above in regard to FIG. 1 to FIG. 3C.

Figure 10A:
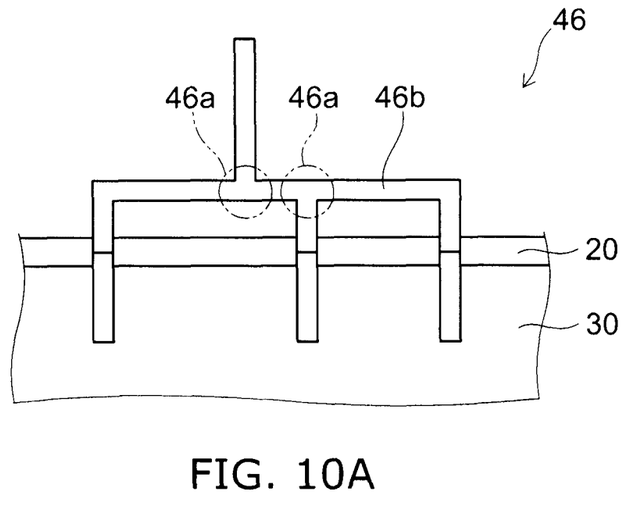
FIG. 10A and FIG. 10B are schematic plan views illustrating other elastic units of this embodiment.
Figure 10B:
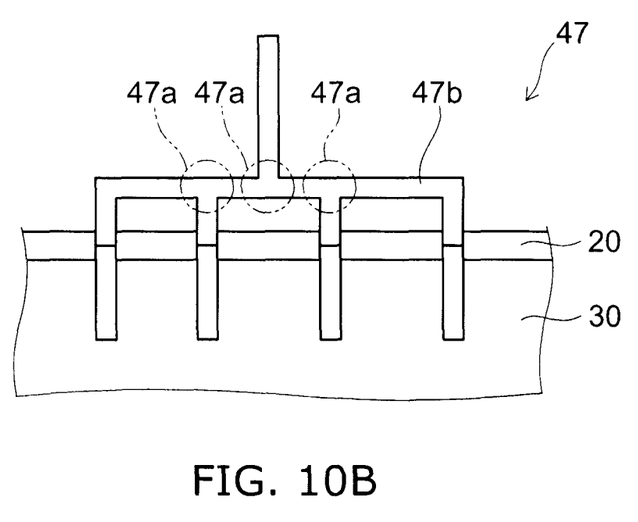

FIG. 10A and FIG. 10B are schematic plan views illustrating other elastic units of this embodiment.

An elastic unit 46 illustrated in FIG. 10A has two branch portions 46a in one straight line portion 46b. Thereby, there can be more connection locations between the elastic unit 46 and the film body unit 30 than in the elastic unit 42 of the electrostatic actuator 10 described above in regard to FIG. 1 to FIG. 3C. Thereby, the stress applied to each of the connection locations between the elastic unit 46 and the film body unit 30 can be reduced further than in the electrostatic actuator 10 described above in regard to FIG. 1 to FIG. 3C. Thereby, the creep resistance of the urging unit 40 can be ensured more reliably.

The elastic unit 47 illustrated in FIG. 10B has three branch portions 47a in one straight line portion 47b. Thereby, there can be more connection locations between the elastic unit 47 and the film body unit 30 than in the elastic unit 42 of the electrostatic actuator 10 described above in regard to FIG. 1 to FIG. 3C and the elastic unit 46 illustrated in FIG. 10A. Thereby, the stress applied to each of the connection locations between the elastic unit 47 and the film body unit 30 can be reduced further than in the electrostatic actuator 10 described above in regard to FIG. 1 to FIG. 3C and the elastic unit 46 illustrated in FIG. 10A. Thereby, the creep resistance of the urging unit 40 can be ensured more reliably.

The stress of the connection locations between the film body unit 30 and the elastic units 42, 46, and 47 and the rigidity of the elastic units 42, 46, and 47 can be mutually substantially uniform by appropriately adjusting the number disposed, the placement position, and the like of the branch portions 42a, 46a, and 47a of the elastic units 42, 46, and 47, respectively. Alternatively, the stress of the connection locations between the film body unit 30 and the elastic units 42, 46, and 47 and the rigidity of the elastic units 42, 46, and 47 can be changed in stages or gradually in the longitudinal direction by appropriately adjusting the number disposed, the placement position, and the like of the branch portions 42a, 46a, and 47a of the elastic units 42, 46, and 47, respectively. In such a case, the timing of the film body unit 30 being pulled toward the electrode unit 20 can be shifted in not only the lateral direction but also the longitudinal direction. For example, in the case where the rigidity of the connection locations between the film body unit 30 and the elastic units 42, 46, and 47 decreases gradually from the central portion toward the two longitudinal-direction circumferential edge portions (the third circumferential edge portion 33 and the fourth circumferential edge portion 34) of the film body unit 30, first, the two longitudinal-direction circumferential edge portions of the film body unit 30 flex. Thereby, the pull-in voltage can be reduced further. Also, the hot switching ability can be improved further.

As described above, the film body unit 30 according to this embodiment has the first hole 61. The first hole 61 is provided such that the longitudinal direction of the film body unit 30 is substantially parallel to the longitudinal direction of the first hole 61. Thereby, the pull-in voltage can be reduced. Also, the hot switching ability can be improved. The elastic unit 42 of the urging unit 40 has the branch portion 42a between the one end connected to the connection unit 41 and the multiple one other ends connected to the film body unit 30. Thereby, the creep resistance of the urging unit 40 can be ensured. Also, the electrostatic actuator 10 can be downsized. The failure probability due to a smaller surface area can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrostatic actuator, comprising:
a substrate;
an electrode unit provided on the substrate;
a film body unit provided to oppose the electrode unit, the film body unit being conductive and having a rectangular configuration; and
an urging unit including a connection unit and an elastic unit, the connection unit being connected to the substrate, the elastic unit being provided between the connection unit and the film body unit, the urging unit being configured to support the film body unit,
a contacting state and a separated state being possible for the electrode unit and the film body unit according to a voltage applied to the electrode unit,
the elastic unit having a plurality of branch portions connected in series between one end of the elastic unit connected to the connection unit and a plurality of one other ends of the elastic unit connected to the film body unit,
wherein the branch portions are configured such that the one other ends of the elastic unit are mutually disposed along the direction of the greater length of the rectangular configuration of the film body unit, and
wherein the one other ends of the elastic unit have lengths extending perpendicular to the direction of the greater length of the rectangular configuration.

2. The electrostatic actuator according to claim 1, wherein:
the film body unit has a first hole extending in a first direction; and
the first direction is the direction of the greater length of the rectangular configuration of the film body unit.

3. The electrostatic actuator according to claim 2, wherein the first hole is provided in a lateral-direction central portion of the film body unit.

4. The electrostatic actuator according to claim 1 comprising a plurality of the urging units,
one selected from the plurality of urging units being connected to a first circumferential edge portion of the film body unit,
one other selected from the plurality of urging units being connected to a second circumferential edge portion opposing the first circumferential edge portion.

5. The electrostatic actuator according to claim 4, wherein the urging unit connected to the first circumferential edge portion and the urging unit connected to the second circumferential edge portion are provided at mutually-opposing positions.

6. The electrostatic actuator according to claim 2, wherein:
the film body unit further has a second hole extending in a second direction; and
the second direction is orthogonal to the direction of the greater length of the rectangular configuration of the film body unit.

7. The electrostatic actuator according to claim 6, wherein:
the film body unit has a plurality of the second holes;
one selected from the plurality of second holes is provided between the first hole and a first circumferential edge portion of the film body unit; and
one other selected from the plurality of second holes is provided between the first hole and a second circumferential edge portion opposing the first circumferential edge portion.

8. The electrostatic actuator according to claim 1, wherein the urging unit has a plurality of the elastic units.

9. The electrostatic actuator according to claim 8, wherein rigidities of the plurality of elastic units are mutually uniform between connection locations between the plurality of elastic units and the film body unit.

10. The electrostatic actuator according to claim 8, wherein rigidities of the plurality of elastic units change in stages or gradually between connection locations between the plurality of elastic units and the film body unit.

11. An electrostatic actuator, comprising:
a substrate;
an electrode unit provided on the substrate;
a film body unit provided to oppose the electrode unit, the film body unit being conductive and having a rectangular configuration, the film body unit having a first hole extending in a first direction and a second hole extending in a second direction; and
an urging unit including a connection unit and an elastic unit, the connection unit being connected to the substrate, the elastic unit being provided between the connection unit and the film body unit, the urging unit being configured to support the film body unit,
a contacting state and a separated state being possible for the electrode unit and the film body unit according to a voltage applied to the electrode unit,
the elastic unit having a branch portion between one end of the elastic unit connected to the connection unit and a plurality of one other ends of the elastic unit connected to the film body unit,
wherein the branch portion is configured such that the one other ends of the elastic unit are mutually disposed along the direction of the greater length of the rectangular configuration of the film body unit,
wherein the one other ends of the elastic unit have lengths extending perpendicular to the direction of the greater length of the rectangular configuration,
wherein the first direction is the direction of the greater length of the rectangular configuration of the film body unit, and wherein the second hole is provided between the first hole and a first circumferential edge portion of the film body unit or between the first hole and a second circumferential edge portion opposing the first circumferential edge portion.

12. The electrostatic actuator according to claim 11, wherein the first hole is provided in a lateral-direction central portion of the film body unit.

13. The electrostatic actuator according to claim 11 comprising a plurality of the urging units,
   one selected from the plurality of urging units being connected to the first circumferential edge portion,
   one other selected from the plurality of urging units being connected to the second circumferential edge portion.

14. The electrostatic actuator according to claim 11, wherein the urging unit connected to the first circumferential edge portion and the urging unit connected to the second circumferential edge portion are provided at mutually-opposing positions.

15. The electrostatic actuator according to claim 11, wherein:
   the film body unit has a plurality of the second holes;
   one selected from the plurality of second holes is provided between the first hole and the first circumferential edge portion; and
   one other selected from the plurality of second holes is provided between the first hole and the second circumferential edge portion.

16. The electrostatic actuator according to claim 11, wherein the urging unit has a plurality of the elastic units.

17. The electrostatic actuator according to claim 16, wherein rigidities of the plurality of elastic units are mutually uniform between connection locations between the plurality of elastic units and the film body unit.

18. The electrostatic actuator according to claim 16, wherein rigidities of the plurality of elastic units change in stages or gradually between connection locations between the plurality of elastic units and the film body unit.

* * * * *